(12) United States Patent
Pekin et al.

(10) Patent No.: US 7,065,721 B2
(45) Date of Patent: Jun. 20, 2006

(54) OPTIMIZED BOND OUT METHOD FOR FLIP CHIP WAFERS

(75) Inventors: Senol Pekin, San Jose, CA (US); Atila Mertol, Cupertino, CA (US); Wilson Choi, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 336 days.

(21) Appl. No.: 10/757,752

(22) Filed: Jan. 14, 2004
(Under 37 CFR 1.47)

(65) Prior Publication Data

US 2005/0028123 A1 Feb. 3, 2005

(51) Int. Cl.
*G06F 17/50* (2006.01)

(52) U.S. Cl. .............................. 716/2; 716/11; 716/12

(58) Field of Classification Search ............... None
See application file for complete search history.

(56) References Cited

U.S. PATENT DOCUMENTS

| | | | |
|---|---|---|---|
| 5,946,477 A * | 8/1999 | Ito | 716/9 |
| 5,972,541 A | 10/1999 | Sugasawara et al. | 430/5 |
| 6,225,143 B1 * | 5/2001 | Rao et al. | 438/106 |
| 6,357,036 B1 * | 3/2002 | Eka et al. | 716/15 |
| 6,510,539 B1 * | 1/2003 | Deemie et al. | 716/2 |
| 6,516,446 B1 * | 2/2003 | Anzai | 716/1 |
| 6,550,047 B1 * | 4/2003 | Becker | 716/8 |
| 6,566,758 B1 * | 5/2003 | Trivedi et al. | 257/774 |
| 6,574,780 B1 * | 6/2003 | Le Coz | 716/4 |
| 6,591,410 B1 * | 7/2003 | Ali et al. | 716/12 |
| 6,601,225 B1 * | 7/2003 | Ohno | 716/8 |
| 6,818,996 B1 * | 11/2004 | Mertol et al. | 257/773 |
| 6,834,381 B1 * | 12/2004 | Gonzalez | 716/13 |
| 6,851,100 B1 * | 2/2005 | You et al. | 716/11 |
| 6,897,563 B1 * | 5/2005 | Bobba et al. | 257/774 |
| 6,953,956 B1 * | 10/2005 | Or-Bach et al. | 257/203 |
| 2004/0164427 A1 * | 8/2004 | Seaman et al. | 257/780 |

* cited by examiner

*Primary Examiner*—Leigh M. Garbowski
(74) *Attorney, Agent, or Firm*—Fitch, Even, Tabin & Flannery

(57) ABSTRACT

A method of optimizing a bond out design includes steps of: (a) receiving as input an initial bond out design including at least one selected I/O pad and a top redistribution layer; (b) determining whether to include a lower redistribution layer in an optimized bond out design; (c) selecting a trace design to be included in the optimized bond out design for connecting the selected I/O pad to the top redistribution layer according to a bump function of the selected I/O pad; and (d) generating as output the optimized bond out design.

25 Claims, 7 Drawing Sheets

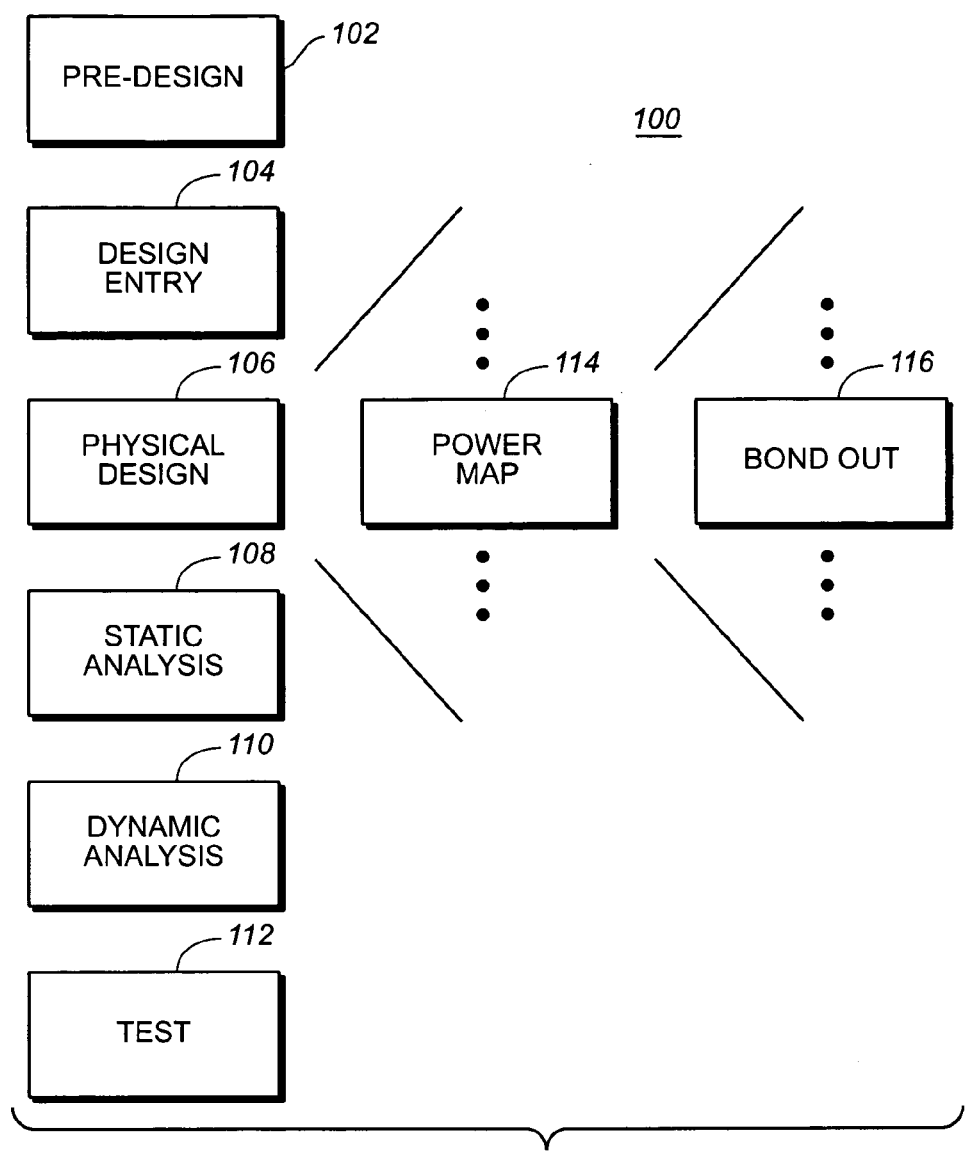
FIG._1
*(PRIOR ART)*
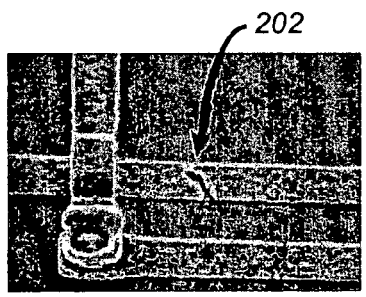
FIG._2
*(PRIOR ART)*
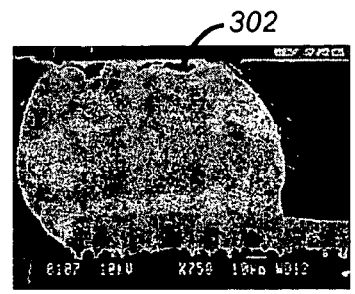
FIG._3
*(PRIOR ART)*

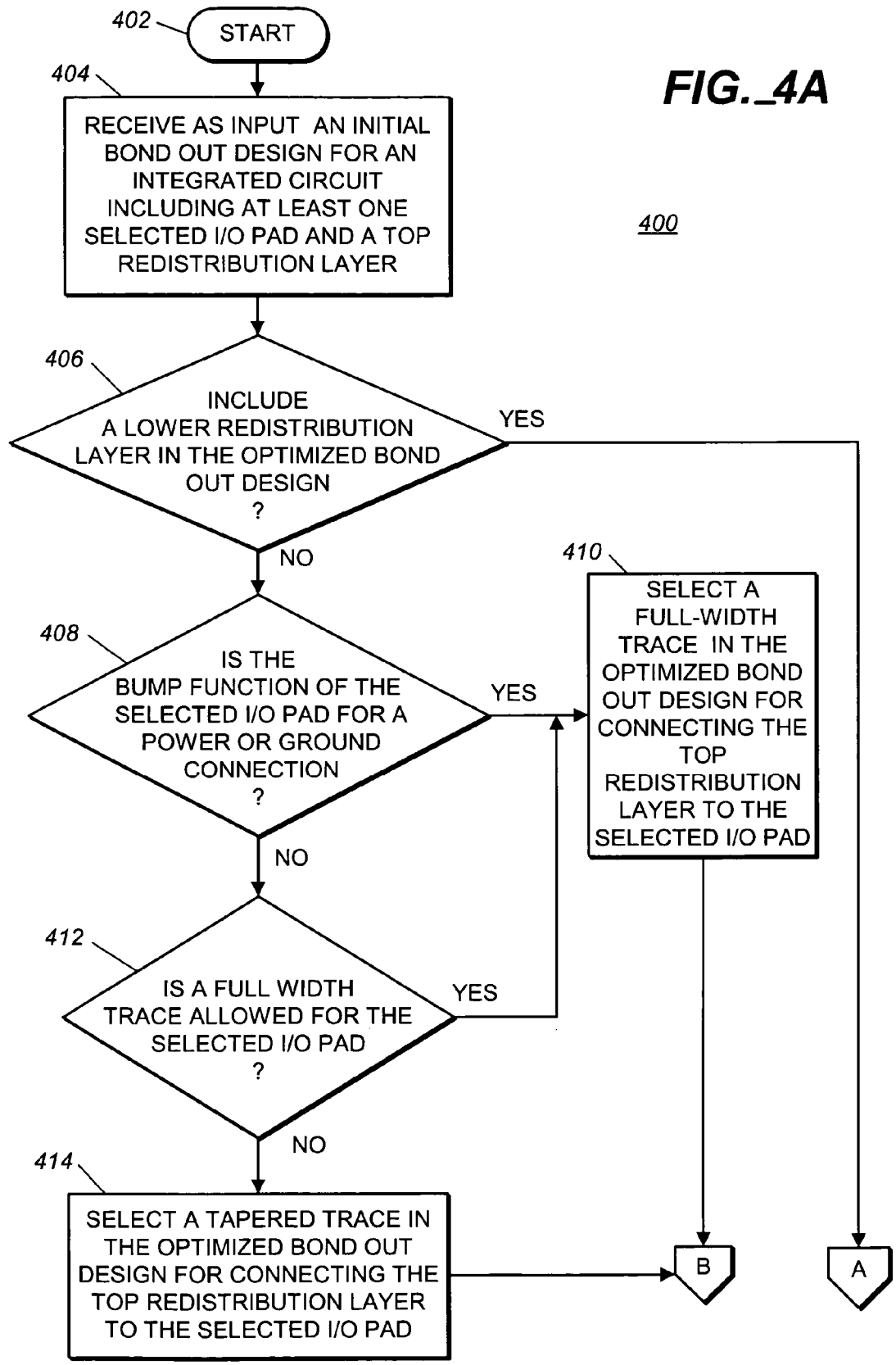
FIG._4A

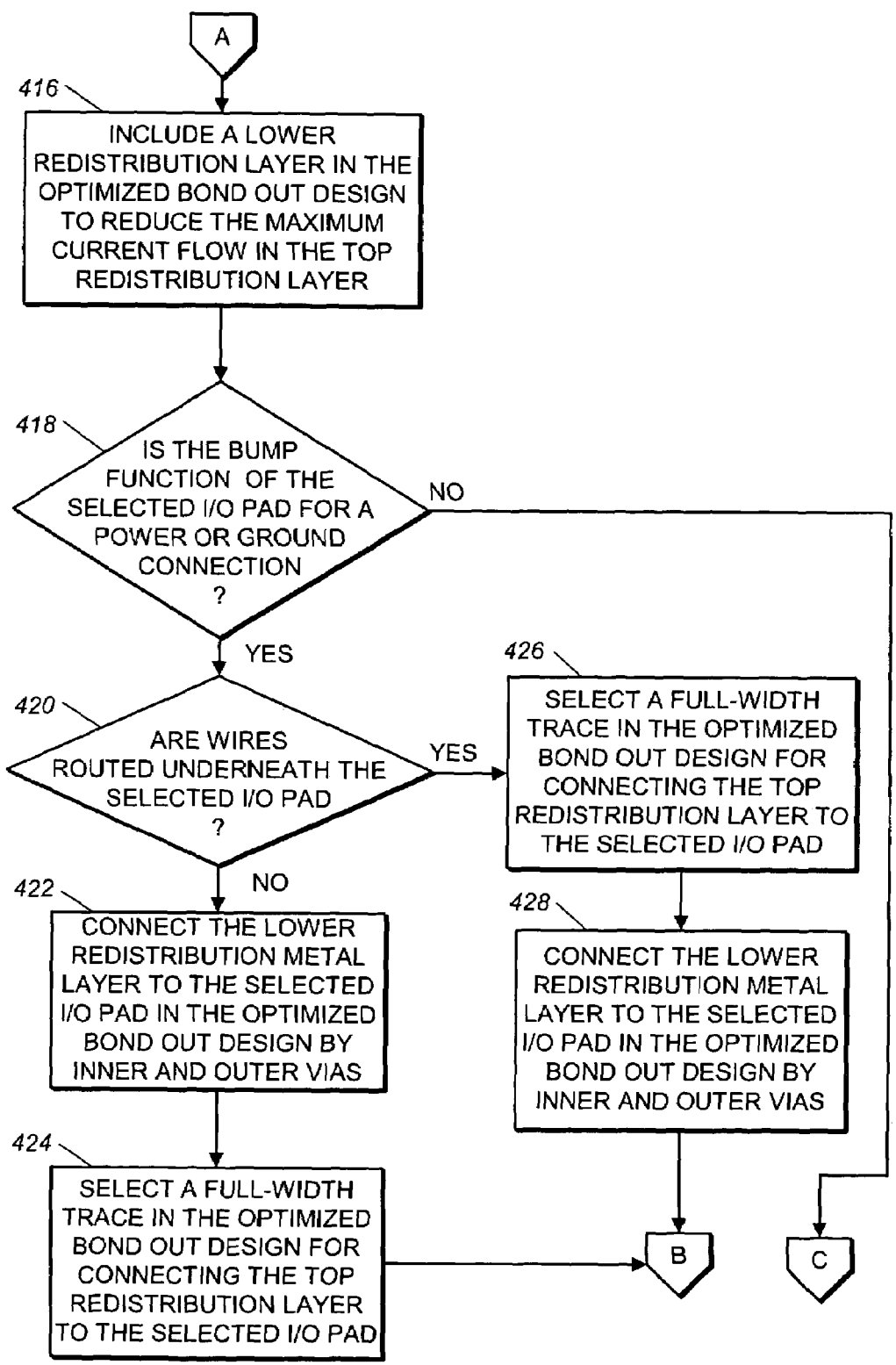
FIG._4B

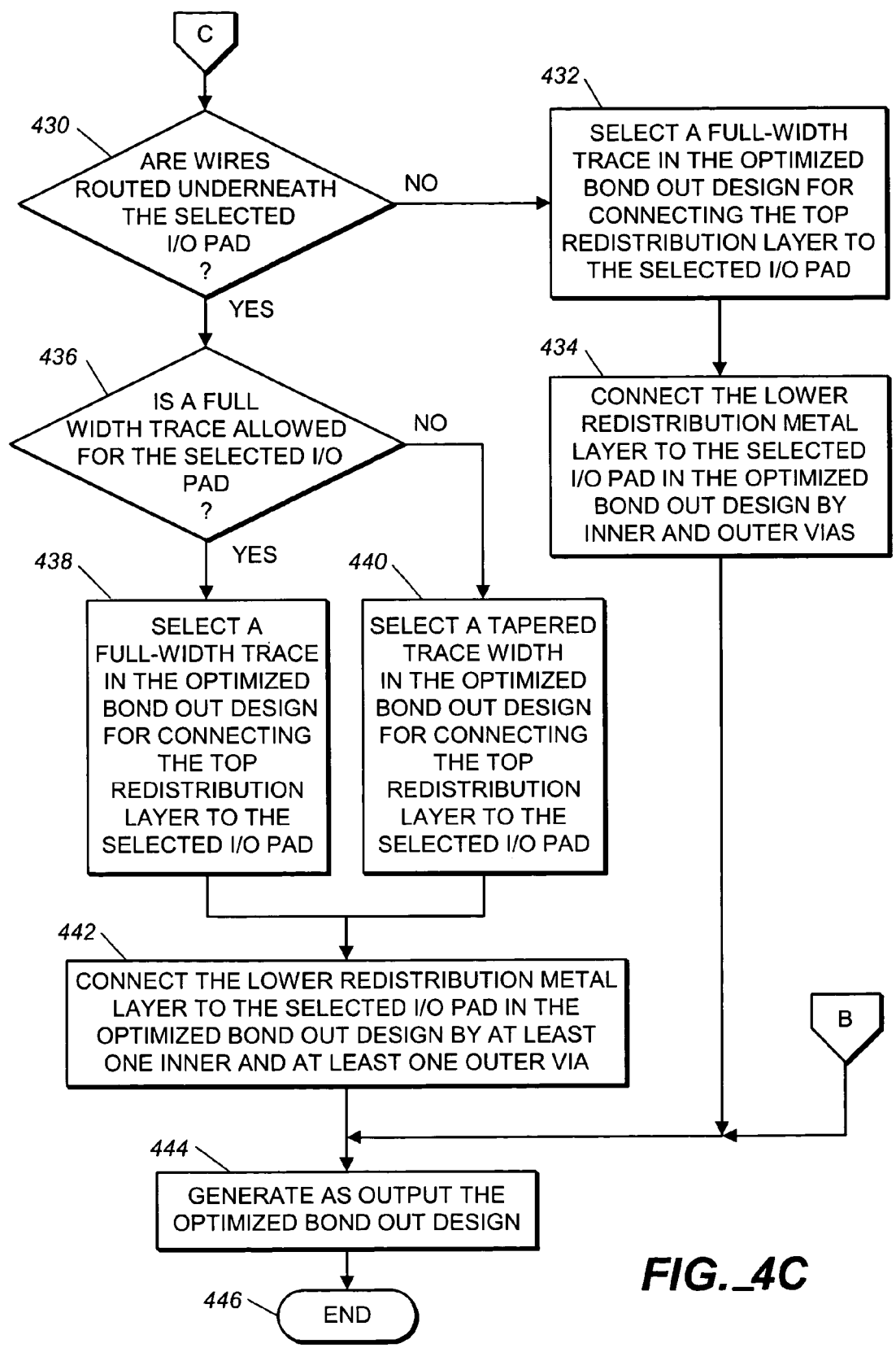
FIG._4C

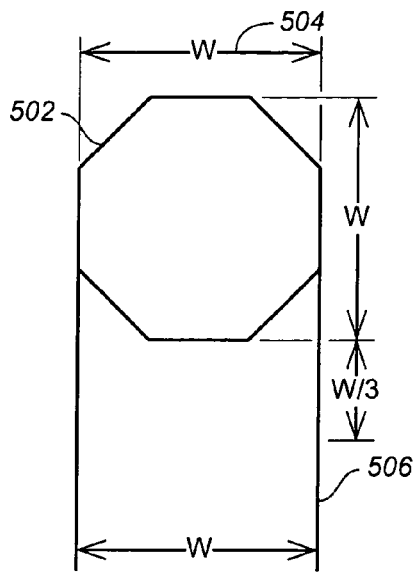
FIG._5
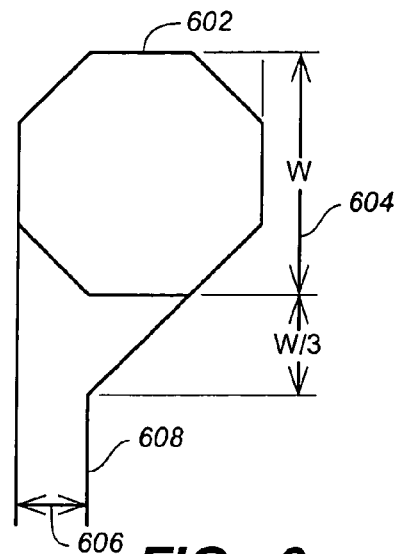
FIG._6
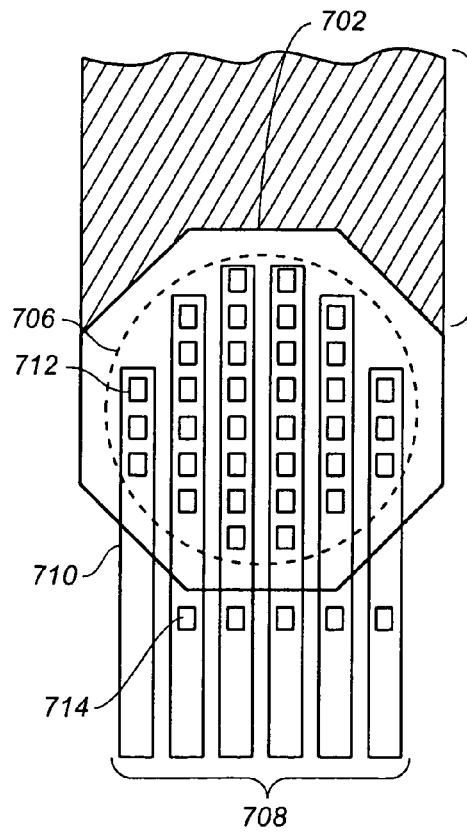
FIG._7
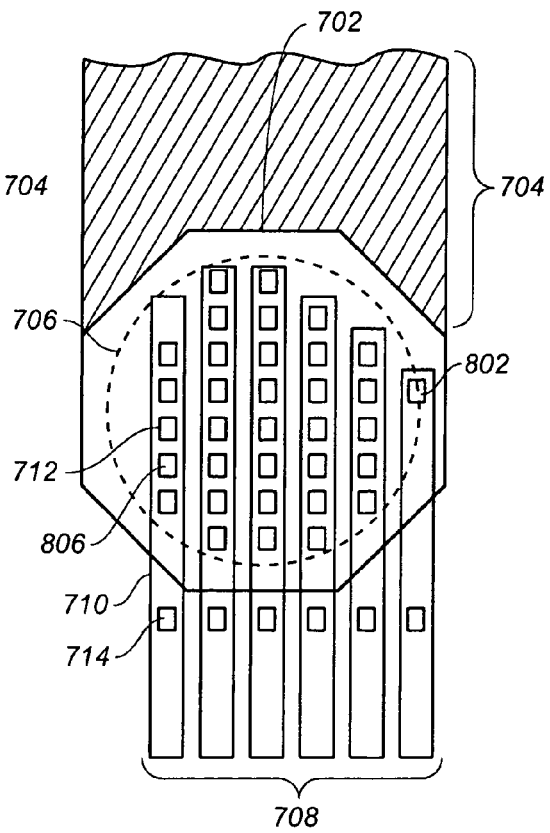
FIG._8

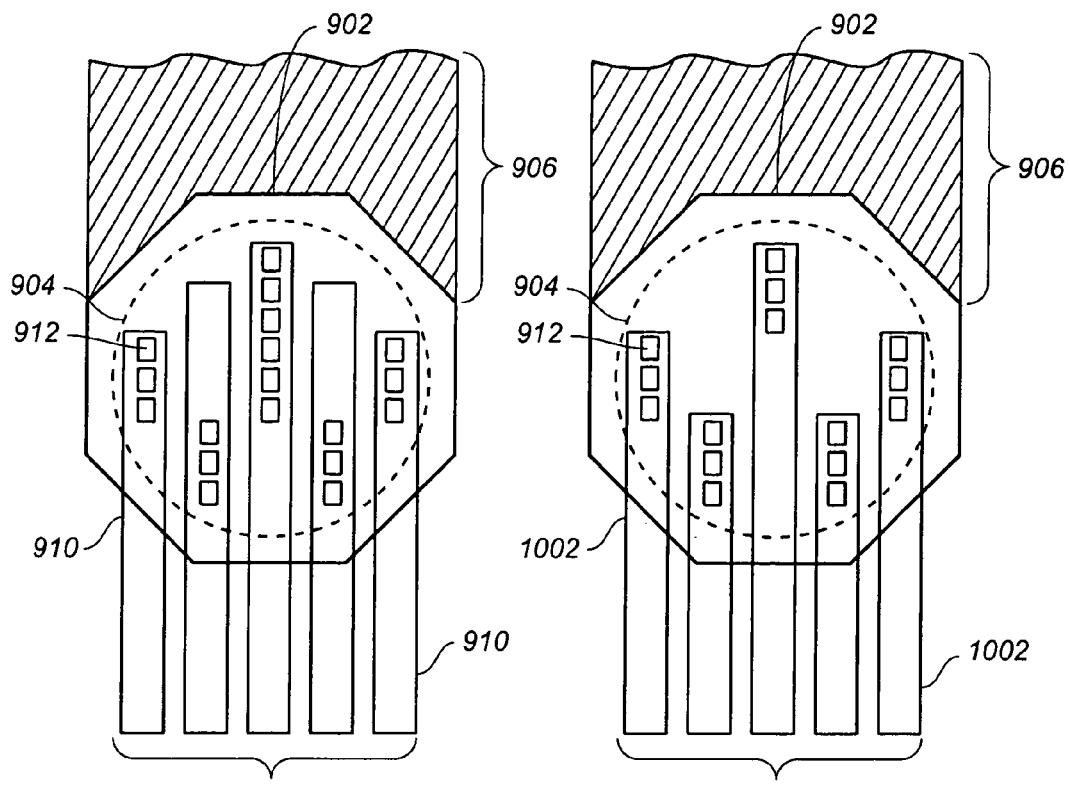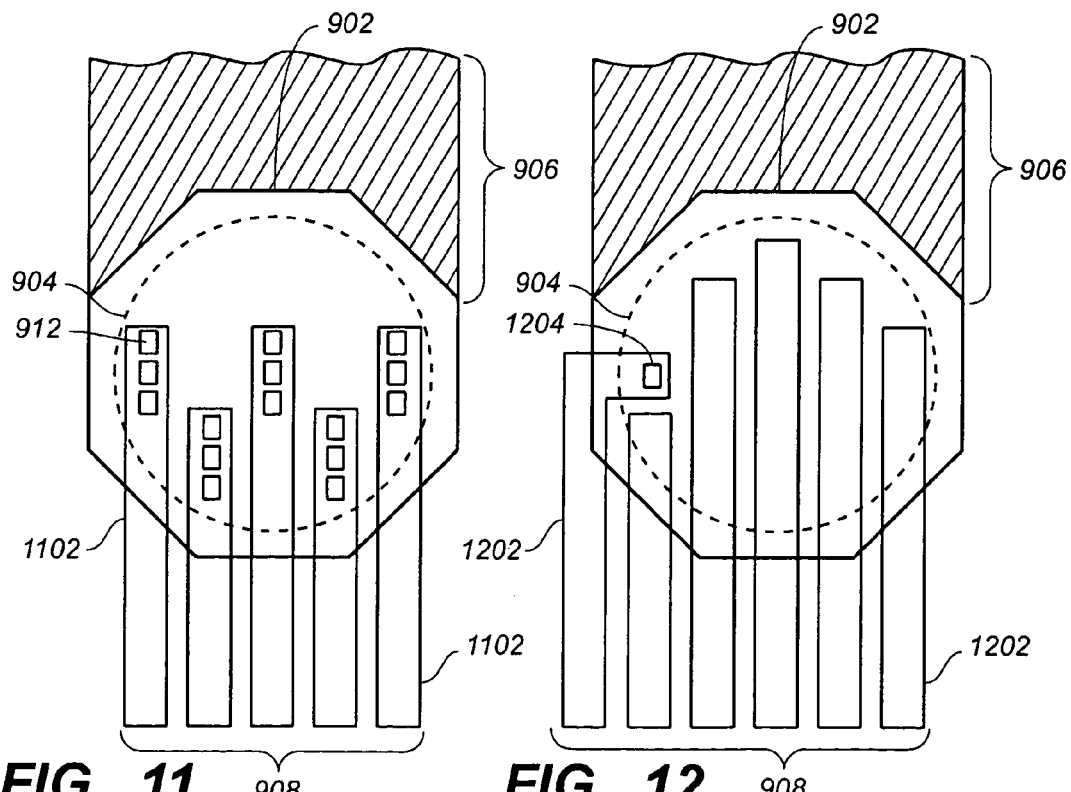

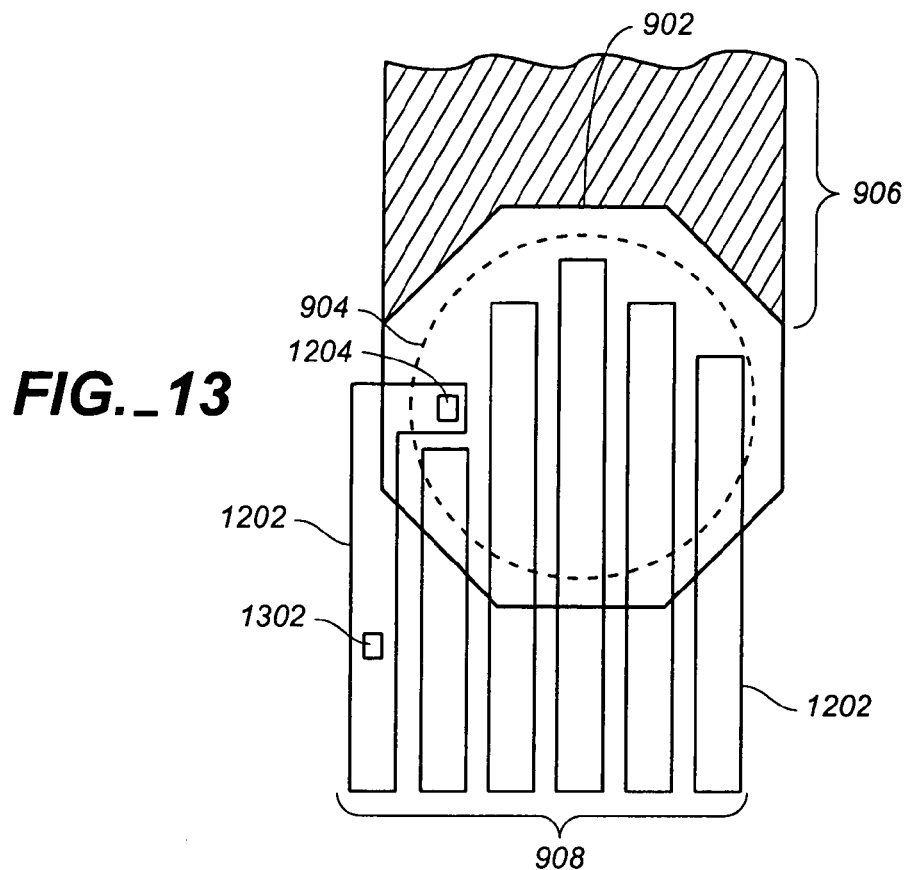
FIG._13
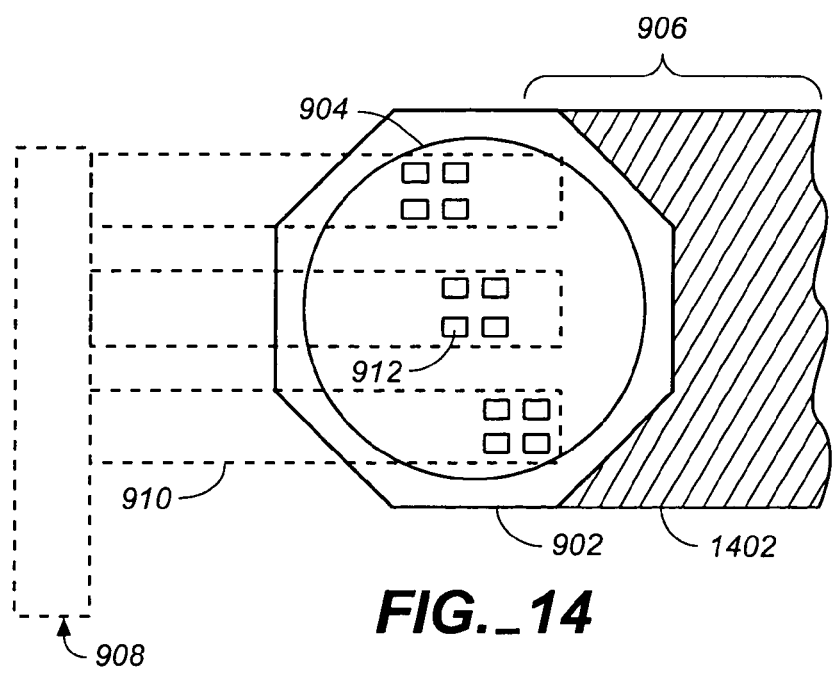
FIG._14

OPTIMIZED BOND OUT METHOD FOR FLIP CHIP WAFERS

BACKGROUND OF THE INVENTION

1. Field of the Invention

The present invention relates generally to the design of flip-chip packages used in the manufacture of integrated circuits. More specifically, but without limitation thereto, the present invention relates to the design of redistribution layers in an integrated circuit die.

2. Description of the Prior Art

An important issue in microelectronic packaging is reliability. Technologies for microelectronic packaging are developed not only to manufacture microelectronic packages at low cost, but also to ensure that the performance of the microelectronic packages will not deteriorate over their service life. A critical factor in determining the service life of an integrated circuit is the redistribution of current in the redistribution layer of the integrated circuit die. The redistribution layer is a conductive metal layer formed on a surface of the die in which traces are formed that connect various signals and power between the die and I/O pads formed on the surface of the die. The I/O pads connect the signals between the traces and the package substrate through solder bumps. In certain areas of the solder bumps near the junctions of the traces and the I/O pads, the maximum current density may shorten the useful life of the integrated circuit. The peaking of the current density at the junctions of the traces and the I/O pads and in the solder bumps is generally referred to as current crowding. It has been discovered that current crowding results in the deterioration of not only the trace junctions, which decreases the wafer level reliability, but also the solder bumps, which decreases the package level reliability.

SUMMARY OF THE INVENTION

In one aspect of the present invention, a method of optimizing a bond out design includes steps of: (a) receiving as input an initial bond out design including at least one selected I/O pad and a top redistribution layer; (b) determining whether to include a lower redistribution layer in an optimized bond out design; (c) selecting a trace design to be included in the optimized bond out design for connecting the selected I/O pad to the top redistribution layer according to a bump function of the selected I/O pad; and (d) generating as output the optimized bond out design.

In another aspect of the present invention, a computer program product for optimizing a bond out design includes:
- a medium for embodying a computer program for input to a computer; and
- a computer program embodied in the medium for causing the computer to perform steps of:
  - (a) receiving as input an initial bond out design including at least one selected I/O pad and a top redistribution layer;
  - (b) determining whether to include a lower redistribution layer in an optimized bond out design;
  - (c) selecting a trace design for connecting the selected I/O pad to the top redistribution layer in the optimized bond out design according to a bump function of the selected I/O pad; and
  - (d) generating as output the optimized bond out design.

In a further aspect of the present invention, a method of optimizing a bond out design includes steps of:

(a) receiving as input an initial bond out design including at least one selected I/O pad and a top redistribution layer;
(b) if a lower redistribution layer is to be included in an optimized bond out design, then transferring control to (g), else transferring control to (c);
(c) if a bump function of the selected I/O pad is for a power or ground connection, then transferring control to step (d), else transferring control to step (e);
(d) selecting a full-width trace to be included in the optimized bond out design for connecting the top redistribution layer to the selected I/O pad and transferring control to step (u);
(e) if a full-width trace is allowed for the selected I/O pad, then transferring control to step (d), else transferring control to step (f);
(f) selecting a tapered trace to be included in the optimized bond out design for connecting the top redistribution layer to the selected I/O pad and transferring control to step (u);
(g) including a lower redistribution layer in the optimized bond out design;
(h) if the bump function of the selected I/O pad is for a power or ground connection, then transferring control to step (i), else transferring control to step (n);
(i) if there are no traces routed underneath the selected I/O pad, then transferring control to step (j), else transferring control to step (l);
(j) connecting the top redistribution layer to the lower redistribution layer in the optimized bond out design by a plurality of inner vias distributed within the projection of the passivation opening onto the lower redistribution layer and by a plurality of outer vias to distribute current evenly between the top redistribution layer and the lower redistribution layer;
(k) selecting a full-width trace to be included in the optimized bond out design for connecting the top redistribution layer to the selected I/O pad and transferring control to step (u);
(l) selecting a full-width trace to be included in the optimized bond out design for connecting the top redistribution layer to the selected I/O pad;
(m) connecting the top redistribution layer to the lower redistribution layer in the optimized bond out design by at least one inner via placed within the projection of the passivation opening onto the lower redistribution layer and by at least one outer via to distribute current evenly between the top redistribution layer and the lower redistribution layer and transferring control to step (u);
(n) if there are no traces routed underneath the selected I/O pad, then transferring control to step (o), else transferring control to step (q);
(o) selecting a full-width trace to be included in the optimized bond out design for connecting the top redistribution layer to the selected I/O pad;
(p) connecting the top redistribution layer to the lower redistribution layer in the optimized bond out design by a plurality of inner vias distributed within the projection of the passivation opening onto the lower redistribution layer and by a plurality of outer vias to distribute current evenly between the top redistribution layer and the lower redistribution layer and transferring control to step (u);
(q) if a full width trace is possible for the selected I/O pad, then transferring control to step (r), else transferring control to step (s), (r) selecting a full-width trace to be included in the optimized bond out design for connecting the top redistribution layer to the selected I/O pad and transferring control to step (t);

(s) selecting a tapered trace to be included in the optimized bond out design for connecting the top redistribution layer to the selected I/O pad;

(t) connecting the top redistribution layer to the lower redistribution layer in the optimized bond out design by at least one inner via placed within the projection of the passivation opening onto the lower redistribution layer and by at least one outer via to distribute current evenly between the top redistribution layer and the lower redistribution layer; and (u) generating as output the optimized bond out design.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a flow chart of a design cycle for a flip chip integrated circuit of the prior art;

FIG. 2 illustrates an example of electromigration failure in a redistribution layer trace of the prior art;

FIG. 3 illustrates a cross-sectional view of an example of electromigration failure in a bumped interconnect of the prior art;

FIGS. 4A, 4B and 4C illustrate a flow chart of a method of optimizing a bond out design according to an embodiment of the present invention;

FIG. 5 illustrates an example of a full-width trace for a power or ground connection in the top redistribution layer according to an embodiment of the present invention;

FIG. 6 illustrates an example of a tapered trace for a signal connection to a selected I/O pad in the top redistribution layer according an embodiment of the present invention;

FIG. 7 illustrates a full array of vias for a power or ground connection between a selected I/O pad and the lower redistribution layer according to an embodiment of the present invention;

FIG. 8 illustrates an example of an improperly located via that is to be avoided according to an embodiment of the present invention;

FIG. 9 illustrates a staggered array of vias for a power or ground connection between a selected I/O pad and a lower redistribution layer according to an embodiment of the present invention;

FIG. 10 illustrates the staggered array of vias of FIG. 9 with shortened trace metal according to an embodiment of the present invention;

FIG. 11 illustrates a staggered array of vias of for a power or ground connection between a selected I/O pad and the lower redistribution layer to allow moderate routing underneath a selected I/O pad according to an embodiment of the present invention;

FIG. 12 illustrates a side connected inner via for a power or ground connection between a selected I/O pad and the lower redistribution layer to allow heavy routing underneath a selected I/O pad according to an embodiment of the present invention;

FIG. 13 illustrates the side connected inner via of FIG. 12 with the addition of an outer via for a power or ground connection between the top redistribution layer and the lower redistribution layer according to an embodiment of the present invention; and FIG. 14 illustrates a summary of features of a bond out design according to various embodiments of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

FIG. 1 illustrates a flow chart 100 of a design cycle for a flip chip integrated circuit of the prior art. Some steps have been omitted in the flow chart 100 to simplify presentation of the context of the present invention in the design cycle. The main phases of a design cycle in this example for a flip-chip ball grid array (FCBGA) are pre-design 102, design entry 104, physical design 106, static analysis 108, dynamic analysis 110, and test 112. The physical design 106 compiles the functions specified in the design entry 104 into a specific arrangement of circuit components on an integrated circuit die. The physical design 106 includes a power map 114 that defines how power and ground are distributed in the flip-chip package to I/O pads on the integrated circuit die. The flip-chip wafer typically includes six to eight metal layers that include the circuitry. In addition, there are one or two redistribution layers on the top of the metal layers within the flip-chip wafer. The power map 114 includes the design of these redistribution layers that are used for the distribution of power, ground, and signals. The bond out 116 is the die-level design process of (1) deciding where the I/O pads should be placed within each metal layer and (2) how the I/O pads should be connected to the bump pads in the flip-chip package.

One of the limiting factors of the service life of a microelectronic package is electromigration. Electromigration is the mass transport of atoms in die interconnects and solder bumps of a microelectronic package. Since the invention of the first integrated circuits in the 1960's, electromigration has been a major problem. As package size and I/O pad dimensions decrease with higher density technologies, reliability may be comprised if measures are not taken to mitigate electromigration. Also, with the implementation of a metal redistribution layer made of copper instead of aluminum, the maximum current density capability of the metal redistribution layer doubles from about $4 \times 10^{-3}$ amperes per square micron to about $8 \times 10^{-3}$ amperes per square micron. The higher current density in the metal redistribution layer results in a correspondingly higher current density in the die interconnects and the solder bumps.

Solder bumps are especially prone to failures due to high current crowding in the area near the junctions between the termination of the redistribution layer traces and the I/O pads. Reducing the maximum current density by improving the distribution of current at junctions between the termination of the redistribution layer traces and the I/O pads can significantly increase the reliability of the solder bumps and consequently that of the integrated circuit.

As the minimum feature size on silicon decreases, rules for designing the redistribution layer in flip chip wafers have been evolving. Specifically, the shape and the dimensions of traces where they are connected to bump pads determines the time-to-failure of the bumped interconnects and the flip chip package due to electromigration of the metal atoms within the bump. Electromigration may also result in current crowding and failures in redistribution layer traces.

FIG. 2 illustrates an example of electromigration failure 202 in a redistribution layer trace of the prior art. As the metal atoms migrate away from an area of current crowding, the trace erodes away until the circuit is broken, as shown in FIG. 2. More recently, research has been directed to electromigration as a cause of failures in bumped interconnects.

FIG. 3 illustrates a cross-sectional view of an example of electromigration failure 302 in a bumped interconnect of the prior art. The darkened area at the top of the bumped interconnect in the photomicrograph indicates where metal erosion has occurred as a result of electromigration.

In one aspect of the present invention, a method of optimizing a bond out design includes steps of: (a) receiving as input an initial bond out design including at least one selected I/O pad and a top redistribution layer; (b) determining whether to include a lower redistribution layer in an optimized bond out design; (c) selecting a trace design to be included in the optimized bond out design for connecting the selected I/O pad to the top redistribution layer according to a bump function of the selected I/O pad; and (d) generating as output the optimized bond out design.

In general, the following factors should be considered in determining the design of the redistribution metal layer:

(1) Design Rules

Design rules are formulated by process engineers and incorporated into the redistribution metal layer layout tools.

(2) Routability

The redistribution metal layer routing has to provide for all the necessary connections.

(3) Trace Resistance

The resistance of the trace determines the voltage drop and the power dissipation in the trace.

(4) Capability of Automating the Design

To avoid errors resulting from manual design procedures, the capability of automating the design is highly desirable.

(5) Electromigration
   (a) Trace Electromigration
   (b) Bump Electromigration

In the present invention, routability is a primary objective while satisfying the design rules of the die as a whole. However, not all input and output pins share the same current load requirements, and optimization of the routing is needed at the I/O pad level. Accordingly, the number of redistribution metal layers, the I/O function, and physical characteristics of the I/O pad are considered in the present invention to prioritize the design requirements at the I/O pad level.

FIGS. 4A, 4B and 4C illustrate a flow chart of a method of optimizing a bond out design according to an embodiment of the present invention.

Step 402 is the entry point of the flow chart 400.

In step 404, an initial bond out design for an integrated circuit including at least one selected I/O pad and a top redistribution layer is received as input. The initial bond out design may be generated, for example, according to standard techniques.

In step 406, a selection is made whether to include a lower redistribution layer in addition to the top distribution layer, for example, if the design maximum bump current value exceeds a maximum allowed bump current for a single redistribution layer. Also, a lower redistribution layer may be included as a function of the metal layer process technology, for example, copper metal layer process technology. If a lower redistribution layer is included, control is transferred to step 416. If a single redistribution layer is selected, then control is transferred to step 408.

In step 408, if a bump function of the selected I/O pad is for a power or ground connection, then control is transferred to step 410. If the bump is used for a signal connection, control is transferred to step 412.

In step 410, a full-width trace as described with reference to FIG. 5 is selected in the optimized bond out design for connecting the top redistribution layer to the selected I/O pad.

FIG. 5 illustrates an example of a full-width trace for a power or ground connection in the top redistribution layer according to an embodiment of the present invention. Shown in FIG. 5 are an I/O pad 502, an I/O pad width 504, and a full-width trace 506.

The full-width trace 506 preferably has a width at least equal to the width of the I/O pad 502 and extends from the edge of the I/O pad 502 by a distance equal to at least one-third the width of the I/O pad 502. In this example, the full-width trace 506 has a width equal to that of the selected I/O pad width 504 and extends further than the minimum one-third of the selected I/O pad width 504 from the edge of the selected I/O pad 502.

The full-width trace 506 may be pre-designed and stored, for example, in a trace library, so that the bond out designer can readily include the selected trace design in the bond out design. After selecting the full-width trace 506 to be included in the optimized bond out design, control is transferred to step 444.

In step 412, if the full-width trace 506 is allowed for the selected I/O pad, then control is transferred to step 410. One of the design constraints in a typical bond out design is to maintain the metal density of the redistribution layer or layers below a selected threshold, for example, 80 percent. The metal density is defined as the ratio of the area covered by metal divided by the total area of the redistribution layer. If selecting the full-width trace 506 in the optimized bond out design exceeds the metal density constraints, or if space for a full-width trace is not available due to obstructions, or if space that would be taken by a full-width trace is required for routing other signals, then selecting a full-width trace is not allowed, and control is transferred to step 414.

In step 414, a tapered trace is selected for connecting the top redistribution layer to the selected I/O pad in the bond out design as described with reference to FIG. 6.

FIG. 6 illustrates an example of a tapered trace for a signal connection to a selected I/O pad in the top redistribution layer according to an embodiment of the present invention. Shown in FIG. 6 are an I/O pad 602, an I/O pad width 604, a tapered trace width 606, and a tapered trace 608.

In this example, the tapered trace 608 has a width equal to that of the selected I/O pad 602 at the end of the tapered trace 608 connected to the selected I/O pad 602 and tapers to the tapered trace width 606 at a distance from the selected I/O pad 602. Preferably, the tapered portion extends at least one-third of the selected I/O pad width 604 from the edge of the selected I/O pad 602 as illustrated in FIG. 6.

The tapered trace 608 may be pre-designed and stored, for example, in a trace library, so that the bond out designer can readily include the trace in the bond out design. After selecting the tapered trace 608 to be included in the optimized bond out design, control is transferred to step 444.

In step 416, a lower redistribution layer under the top redistribution layer is included in the optimized bond out design to reduce the maximum current flow in the top redistribution layer. The redistribution layers may be slotted or otherwise patterned to satisfy physical design rules in the redistribution layers according to well-known techniques.

In step 418, if a bump function of the selected I/O pad is for a power or ground connection, then control is transferred to step 420. If the bump function is for a signal connection, then control is transferred to step 430.

In step 420, if there are no traces routed underneath the selected I/O pad in the lower redistribution layer, then control is transferred to step 422, otherwise, control is transferred to step 426.

In step 422, the lower redistribution metal layer is connected to the selected I/O pad in the optimized bond out design by inner vias and by outer vias as described below.

FIG. 7 illustrates a full array of vias for a power or ground connection between a selected I/O pad and the lower redistribution layer according to an embodiment of the present invention. Shown in FIG. 7 are an I/O pad 702, a top redistribution layer 704, a passivation opening 706, a lower distribution layer 708, lower redistribution layer traces 710, inner vias 712, and outer vias 714. In the example of FIG. 7, a full-width trace is formed in the top redistribution layer 704 shown by the solid hatched area. Alternatively, the top redistribution layer 704 may be slotted or patterned according to well-known techniques to meet physical design rules. The lower distribution layer 708 in FIG. 7 may be formed, for example, as a solid layer, a slotted layer, or as the parallel lower redistribution layer traces 710. The inner vias 712 are preferably located inside the area enclosed by a projection of the passivation opening 706 on the lower redistribution layer 708 as illustrated in FIG. 7. The outer vias 714 connect the traces in the lower redistribution layer 708 to the traces in the top redistribution layer 704 to balance current flow evenly between the lower redistribution layer 708 and the top redistribution layer 704. The outer vias 714 are preferably located outside the area enclosed by the I/O pad 702.

FIG. 8 illustrates an example of an improperly placed via of the prior art. Shown in FIG. 8 are an I/O pad 702, a top redistribution layer 704, a passivation opening 706, a lower distribution layer 708, lower redistribution layer traces 710, outer vias 714, an improperly placed inner via 802, and properly placed inner vias 806. The improperly placed via 802 is located outside the projection of the passivation opening 706 of the I/O pad 702. The current flowing into the passivation opening 706 from the outermost lower redistribution layer trace 710 through the improperly placed via 802 must therefore negotiate a right angle turn between the lower distribution layer 708 and the passivation opening 706. The current flowing through the right angle results in current crowding and electromigration in the bumped interconnect. By placing the vias well within the projection of the passivation opening 706 of the I/O pad 702 as illustrated by the properly placed inner vias 806, a significant source of current crowding is advantageously avoided.

FIG. 9 illustrates a staggered array of vias for a power or ground connection between a selected I/O pad and a lower redistribution layer according to an embodiment of the present invention. Shown in FIG. 9 are an I/O pad 902, a passivation opening 904, a top redistribution layer 906, a lower redistribution layer 908, trace segments 910, and inner vias 912.

In the example of FIG. 9, the top redistribution layer 906 is connected to the I/O pad 902 from the side opposite to the side of the I/O pad 902 connected to the lower redistribution layer 908. The lower redistribution metal layer 908 is routed underneath the I/O pad 902 by the trace segments 910. The inner vias 912 connect the top redistribution layer 906 to the lower redistribution metal layer 908 and are staggered as shown in FIG. 9 to distribute the current homogeneously across the selected I/O pad 902. The inner vias 912 are preferably located within the projection of the passivation opening 904 away from the edge of the passivation opening 904. Preferably, the inner vias 912 should be arranged to distribute current evenly across the selected I/O pad 902. Also, the traces in the top redistribution metal layer 906 and the traces in the lower redistribution metal layer 908 are connected to the selected I/O pad 902 from opposite sides of the selected I/O pad 902 as shown in FIG. 9.

FIG. 10 illustrates the staggered array of vias of FIG. 9 with shortened trace metal according to an embodiment of the present invention. Shown in FIG. 10 are an I/O pad 902, a passivation opening 904, a top redistribution layer 906, a lower redistribution layer 908, trace segments 1002, and vias 912.

In FIG. 10, the ends of the trace segments 1002 that extend beyond the vias 912 do not conduct current, and are therefore removed to reduce the metal density in the lower redistribution layer.

FIG. 11 illustrates a staggered array of vias of for a power or ground connection between a selected I/O pad and the lower redistribution layer to allow moderate routing underneath a selected I/O pad according to an embodiment of the present invention. Shown in FIG. 11 are an I/O pad 902, a passivation opening 904, a top redistribution layer 906, a lower redistribution layer 908, trace segments 1102, and vias 912.

In FIG. 11, the middle trace segments 1102 and vias 912 are arranged so that approximately one-third of the passivation opening 904 is clear for routing traces underneath the selected I/O pad 902.

In step 424, a full-width trace is selected in the optimized bond out design for connecting the top redistribution layer to the selected I/O pad as described in step 410, and control is transferred to step 444.

In step 426, a full-width trace is selected in the optimized bond out design for connecting the top redistribution layer to the selected I/O pad as described in step 410. In addition, the lower redistribution layer may be connected to the selected I/O pad 902 by inner vias 912 to distribute current evenly across the selected I/O pad 902 as illustrated in FIGS. 9, 10 and 11. In designs where extensive routing of traces is required underneath the selected I/O pad, a connection between the lower redistribution layer and the selected I/O pad may be made as illustrated in FIG. 12.

FIG. 12 illustrates a side connected via for a power or ground connection between a selected I/O pad and the lower redistribution layer to allow heavy routing in the lower redistribution layer underneath a selected I/O pad according to an embodiment of the present invention. Shown in FIG. 12 are an I/O pad 902, a passivation opening 904, lower redistribution layer trace segments 1202, and a side connected inner via 1204.

In FIG. 12, the side connected inner via 1204 provides current flow to the selected I/O pad 902 from one of the trace segments 1202 in the lower redistribution layer while allowing the rest of the trace segments 1202 to be routed underneath the selected I/O pad 902 to other destinations.

FIG. 13 illustrates the side connected inner via of FIG. 12 with the addition of an outer via 1302 for a power or ground connection between the top redistribution layer and the lower redistribution layer according to an embodiment of the present invention. Shown in FIG. 13 are an I/O pad 902, a passivation opening 904, a top redistribution layer 906, a lower redistribution layer 908, trace segments 1302, a side connected inner via 1204, and an outer via 1302.

In FIG. 13, the outer via 1302 balances the current flow between the top redistribution layer 906 and the lower redistribution layer 908 to the selected I/O pad 902 while allowing the rest of the trace segments 1202 to be routed underneath the selected I/O pad 902.

In step 428, the lower redistribution layer is connected to the selected I/O pad in the optimized bond out design as described above, and control is transferred to step 444.

In step 430, if there are no traces routed underneath the selected I/O pad, then control is transferred to step 432, otherwise, control is transferred to step 436.

In step 432, a full-width trace is selected for connecting the top redistribution layer to the selected I/O pad in the optimized bond out design as described in step 410.

In step 434, the top redistribution layer is connected to the lower redistribution layer by a plurality of inner vias distributed within a projection of a passivation opening of the selected I/O pad onto the lower redistribution layer and by a plurality of outer vias as described above, and control is transferred to step 444.

In step 436, if a full-width trace is allowed for the selected I/O pad, that is, if a full-width trace does not exceed the metal density constraints of the top redistribution layer, then control is transferred to step 438, otherwise, control is transferred to step 440.

In step 438, a full-width trace is selected in the optimized bond out design for connecting the top redistribution layer to the selected I/O pad as described in step 410, and control is transferred to step 442.

In step 440, a tapered trace is selected in the optimized bond out design for connecting to the selected I/O pad as described in step 414.

In step 442, the top redistribution layer is connected to the lower redistribution layer in the optimized bond out design by at least one inner via placed within a projection of a passivation opening of the selected I/O pad onto the lower redistribution layer and by at least one outer via to balance current between the top redistribution layer and the lower redistribution layer as described above.

In step 444, the optimized bond out design is generated as output.

Step 446 is the exit point of the flow chart 400.

FIG. 14 illustrates a summary of features of a bond out design according to various embodiments of the present invention. Shown in FIG. 14 are an I/O pad 902, a passivation opening 904, a top redistribution layer 906, a lower redistribution layer 908, trace segments 910, inner vias 912, and a top redistribution layer trace 1402.

In FIG. 14, the top redistribution layer trace 1402 indicated by the hatch pattern connecting the I/O pad 902 with the top redistribution layer 906 is preferably a full-width trace for I/O pads having a bump function for power and ground connections. The trace segments 910 in the lower redistribution layer 908 are preferably routed on a side opposite to that of the top redistribution layer trace 1402 as a design safety mechanism to avoid inadvertently placing the inner vias 912 near the edge of the passivation opening 904, where current is also flowing into the bumped interconnect from the top redistribution layer trace 1402. Placing the inner vias 912 away from the edge of the passivation opening 904 where the top redistribution layer trace 1402 is connected to the selected I/O pad 902 distributes the current flow more evenly across the selected I/O pad 902 and avoids current crowding that could severely shorten the life of a bumped interconnect formed on the I/O pad 902. The inner vias 912 are also placed in a staggered pattern to distribute current more uniformly across the selected I/O pad 902.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

In another aspect of the present invention, the method illustrated in the flowchart description above may be embodied in a computer program product and implemented by a computer according to well known programming techniques to perform the following functions:

(a) receiving as input an initial bond out design including at least one selected I/O pad and a top redistribution layer;

(b) determining whether to include a lower redistribution layer in an optimized bond out design;

(c) selecting a trace design to be included in the optimized bond out design for connecting the selected I/O pad to the top redistribution layer according to a bump function of the selected I/O pad; and (d) generating as output the optimized bond out design.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of optimizing a bond out design comprising steps of:

(a) receiving as input an initial bond out design including at least one selected I/O pad and a top redistribution layer;

(b) determining whether to include a lower redistribution layer in an optimized bond out design;

(c) selecting a trace design to be included in the optimized bond out design for connecting the selected I/O pad to the top redistribution layer according to a bump function of the selected I/O pad; and (d) generating as output the optimized bond out design.

2. The method of claim 1 wherein step (b) comprises including a lower redistribution layer in the optimized bond out design.

3. The method of claim 2 wherein step (b) further comprises placing a plurality of inner vias to be included in the optimized bond out design between the selected I/O pad and the lower redistribution layer to connect the selected I/O pad to the lower redistribution layer.

4. The method of claim 3 further comprising placing the plurality of inner vias to be included in the optimized bond out design within a projection of a passivation opening of the selected I/O pad onto the lower redistribution layer.

5. The method of claim 4 further comprising distributing the plurality of inner vias in the optimized bond out design to minimize peak current density in the selected I/O pad.

6. The method of claim 4 further comprising extending trace metal in the optimized bond out design into the projection of the passivation opening by at least one-third of a width of the projection of the passivation opening.

7. The method of claim 4 further comprising arranging the plurality of inner vias to be included in the optimized bond out design in a staggered pattern to distribute current evenly across the passivation opening.

8. The method of claim 7 further comprising shortening trace metal in the lower redistribution layer to allow routing of traces in the lower redistribution layer underneath the selected I/O pad.

9. The method of claim 8 further comprising arranging the inner plurality of vias in the optimized bond out design within an area equal to about two-thirds of a width of the passivation opening to allow additional routing of traces underneath the selected I/O pad.

10. The method of claim 2 further comprising a step of placing a plurality of outer vias to be included in the optimized bond out design between the top redistribution layer and the lower redistribution layer to balance current between the top redistribution layer and the lower redistribution layer.

11. The method of claim 1 wherein step (d) comprises selecting one of a full-width trace and a tapered trace.

12. The method of claim 1 wherein step (b) includes determining whether to include a lower redistribution layer as a function of the design maximum bump current value or as a function of a metal layer packaging technology.

13. A computer program product for optimizing a bond out design comprising:
 a medium for embodying a computer program for input to a computer; and
 a computer program embodied in the medium for causing the computer to perform steps of:
  (a) receiving as input an initial bond out design including at least one selected I/O pad and a top redistribution layer;
  (b) determining whether to include a lower redistribution layer in an optimized bond out design;
  (c) selecting a trace design to be included in the optimized bond out design for connecting the selected I/O pad to the top redistribution layer according to a bump function of the selected I/O pad; and
  (d) generating as output the optimized bond out design.

14. The computer program product of claim 13 wherein step (b) comprises including a lower redistribution layer in the optimized bond out design.

15. The computer program product of claim 14 wherein step (b) further comprises placing a plurality of inner vias in the optimized bond out design between the selected I/O pad and the lower redistribution layer to connect the selected I/O pad to the lower redistribution layer.

16. The computer program product of claim 15 further comprising placing the plurality of inner vias in the optimized bond out design within a projection of a passivation opening of the selected I/O pad onto the lower redistribution layer.

17. The computer program product of claim 16 further comprising distributing the plurality of inner vias in the optimized bond out design to minimize peak current density in the selected I/O pad.

18. The computer program product of claim 17 further comprising extending trace metal in the optimized bond out design into the projection of the passivation opening by at least one-third of a width of the projection of the passivation opening.

19. The computer program product of claim 18 further comprising arranging the plurality of inner vias to be included in the optimized bond out design in a staggered pattern to distribute current evenly across the passivation opening.

20. The computer program product of claim 19 further comprising shortening trace metal in the lower redistribution layer to allow routing of traces underneath the selected I/O pad.

21. The computer program product of claim 20 further comprising arranging the inner plurality of vias to be included in the optimized bond out design within an area equal to about two-thirds of a width of the passivation opening to allow additional routing of traces underneath the selected I/O pad.

22. The computer program product of claim 14 further comprising placing a plurality of outer vias in the optimized bond out design between the top redistribution layer and the lower redistribution layer to balance current between the top redistribution layer and the lower redistribution layer.

23. The computer program product of claim 13 wherein step (d) comprises selecting one of a full-width trace width and a tapered trace.

24. The computer program product of claim 13 wherein step (b) includes determining whether to include a lower redistribution layer as one of a function of the design maximum bump current value and a function of a metal layer packaging technology.

25. A method of optimizing a bond out design comprising steps of:
 (a) receiving as input an initial bond out design including at least one selected I/O pad and a top redistribution layer;
 (b) if a lower redistribution layer is to be included in an optimized bond out design, then transferring control to (g), else transferring control to (c);
 (c) if a bump function of the selected I/O pad is for a power or ground connection, then transferring control to step (d), else transferring control to step (e);
 (d) selecting a full-width trace to be included in the optimized bond out design for connecting the top redistribution layer to the selected I/O pad and transferring control to step (u);
 (e) if a full-width trace is allowed for the selected I/O pad, then transferring control to step (d), else transferring control to step (f);
 (f) selecting a tapered trace to be included in the optimized bond out design for connecting the top redistribution layer to the selected I/O pad and transferring control to step (u);
 (g) including a lower redistribution layer in the optimized bond out design;
 (h) if the bump function of the selected I/O pad is for a power or ground connection, then transferring control to step (i), else transferring control to step (n);
 (i) if there are no traces routed underneath the selected I/O pad, then transferring control to step (j), else transferring control to step (l);
 (j) connecting the top redistribution layer to the lower redistribution layer in the optimized bond out design by a plurality of inner vias distributed within the projection of the passivation opening onto the lower redistribution layer and by a plurality of outer vias to distribute current evenly between the top redistribution layer and the lower redistribution layer;
 (k) selecting a full-width trace to be included in the optimized bond out design for connecting the top redistribution layer to the selected I/O pad and transferring control to step (u);
 (l) selecting a full-width trace to be included in the optimized bond out design for connecting the top redistribution layer to the selected I/O pad;

(m) connecting the top redistribution layer to the lower redistribution layer in the optimized bond out design by at least one inner via placed within the projection of the passivation opening onto the lower redistribution layer and by at least one outer via to distribute current evenly between the top redistribution layer and the lower redistribution layer and transferring control to step (u);

(n) if there are no traces routed underneath the selected I/O pad, then transferring control to step (o), else transferring control to step (q);

(o) selecting a full-width trace to be included in the optimized bond out design for connecting the top redistribution layer to the selected I/O pad;

(p) connecting the top redistribution layer to the lower redistribution layer in the optimized bond out design by a plurality of inner vias distributed within the projection of the passivation opening onto the lower redistribution layer and by a plurality of outer vias to distribute current evenly between the top redistribution layer and the lower redistribution layer and transferring control to step (u);

(q) if a full width trace is possible for the selected I/O pad, then transferring control to step (r), else transferring control to step (s), (r) selecting a full-width trace in the optimized bond out design for connecting the top redistribution layer to the selected I/O pad and transferring control to step (t);

(s) selecting a tapered trace to be included in the optimized bond out design for connecting the top redistribution layer to the selected I/O pad;

(t) connecting the top redistribution layer to the lower redistribution layer in the optimized bond out design by at least one inner via placed within the projection of the passivation opening onto the lower redistribution layer and by at least one outer via to distribute current evenly between the top redistribution layer and the lower redistribution layer; and (u) generating as output the optimized bond out design.

* * * * *